United States Patent
Suda

(10) Patent No.: US 8,149,380 B2
(45) Date of Patent: Apr. 3, 2012

(54) EXPOSURE APPARATUS AND CORRECTION APPARATUS

(75) Inventor: Hiromi Suda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 617 days.

(21) Appl. No.: 12/246,158

(22) Filed: Oct. 6, 2008

(65) Prior Publication Data

US 2009/0097005 A1    Apr. 16, 2009

(30) Foreign Application Priority Data

Oct. 10, 2007    (JP) .................... 2007-264590

(51) Int. Cl.
*G03B 27/68* (2006.01)
*G03B 27/54* (2006.01)
*G03B 27/42* (2006.01)
*G03B 27/52* (2006.01)

(52) U.S. Cl. ............ 355/52; 355/53; 355/55; 355/67

(58) Field of Classification Search .......... 355/52, 355/53, 55, 67–71, 77; 250/492.1, 492.2, 250/492.22, 493.1, 548; 356/124–127
See application file for complete search history.

(56) References Cited

U.S. PATENT DOCUMENTS

| | | | | |
|---|---|---|---|---|
| 5,307,207 A | * | 4/1994 | Ichihara | 359/622 |
| 5,731,577 A | * | 3/1998 | Tanitsu | 250/201.5 |
| 5,739,899 A | * | 4/1998 | Nishi et al. | 355/53 |
| 6,081,320 A | * | 6/2000 | Tanitsu | 355/71 |
| 6,211,944 B1 | * | 4/2001 | Shiraishi | 355/53 |
| 6,665,051 B2 | * | 12/2003 | Komatsuda | 355/67 |
| 2002/0154282 A1 | * | 10/2002 | Mori | 355/53 |
| 2004/0233411 A1 | * | 11/2004 | Shiraishi | 355/67 |
| 2007/0081241 A1 | * | 4/2007 | Hayashi | 359/443 |

FOREIGN PATENT DOCUMENTS

| | | | |
|---|---|---|---|
| JP | 61047633 A | * | 3/1986 |
| JP | 11-145033 A | | 5/1999 |
| JP | 2000-077315 A | | 3/2000 |
| JP | 2005-150541 A | | 6/2005 |

OTHER PUBLICATIONS

English translation of JP11-145033, published on May 28, 1999.*

* cited by examiner

*Primary Examiner* — Peter B Kim
*Assistant Examiner* — Christina Riddle
(74) *Attorney, Agent, or Firm* — Canon U.S.A., Inc. IP Dvivision

(57) ABSTRACT

An exposure apparatus is configured to expose a pattern of an original on a substrate by using light from a light source. The exposure apparatus includes an illumination optical system configured to illuminate the original by polarized light by using the light from the light source, and a correction unit configured to correct misalignment of the optical axis of the light from the light source and the optical axis of the illumination optical system. The correction unit includes a first lens and a deflecting member, the first lens can move in a direction perpendicular to an optical axis of the lens, and a deflecting direction of the light deflected by the deflecting member is variable.

7 Claims, 5 Drawing Sheets

EXPOSURE APPARATUS AND CORRECTION APPARATUS

BACKGROUND OF THE INVENTION

1. Field of the Invention

The present invention relates to an exposure apparatus and a correction apparatus.

2. Description of the Related Art

A projection exposure apparatus configured to illuminate an original (e.g., a reticle or a mask) by an illumination optical system, and expose a pattern of the original on a substrate such as a wafer by using a projection optical system has been conventionally used. There is an increasing demand to improve resolution and throughput of such exposure apparatuses. One efficient method to obtain high resolution is to shorten a wavelength of an exposure light and increase a numerical aperture ("NA") of the projection optical system (also called "high-NA").

If an excimer laser of larger size replaces an extra high pressure mercury lamp of relatively smaller size in order to shorten a wavelength of an exposure light, an exposure apparatus as a main body cannot be equipped with a light source. For example, the main exposure apparatus has to be arranged on the second floor, and the light source unit has to be on the first floor. As a result, an oscillation displaces the relative position between the main exposure apparatus and the light source unit, causing the positional and the angular misalignment of the optical axes (a central beam of light) of the illumination light and the illumination optical system. Accordingly, the positional and the angular misalignment needs to be eliminated as disclosed in Japanese Patent Laid-Open No. 11(1999)-145033, Japanese Patent Laid-Open No. 2000-77315, and Japanese Patent Laid-Open No. 2005-150541.

Meanwhile, a contrast of an interference pattern formed by a line and space (L&S) pattern of an original to a photoresist will be lower when it is P-polarized light to diffraction light of the L&S, and in particular it will be remarkably lower along with a high NA such as immersion exposure. For this reason, polarized illumination which utilizes S-polarized light (i.e., light, of which the oscillation direction of the vector in the electric field is parallel to the base surface and is perpendicular to the light traveling direction) is considered to be applied. In this case, the imaging performance becomes sensitive to birefringence that is a polarization characteristic of an optical system.

Japanese Patent Laid-Open No. 11(1999)-145033 and Japanese Patent Laid-Open No. 2000-77315 propose that a positional misalignment of an optical axis is corrected by rotating a mirror, and a positional misalignment of an optical axis is corrected by tilting a parallel plate. However, birefringence that is so called "intrinsic birefringence" due to the crystal structures can occur by tilting the parallel plate. In particular, the parallel plate has a thickness of 50 to 150 mm and the tilting angle of around 20° to the optical axis. Then, the influence of the intrinsic birefringence cannot be ignored. Then, the influence of the intrinsic birefringence cannot be ignored. Sufficiently significant intrinsic birefringence will distort a polarization state in the polarized illumination from the predetermined state and lower the imaging performance. Further, the thick parallel plate having the low light transmittance will lower the throughputs.

SUMMARY OF THE INVENTION

The present invention is directed to a correction apparatus and an exposure apparatus configured to correct misalignment of an optical axis without using a parallel plate, and achieve high resolution by using polarized illumination.

An exposure apparatus according to one aspect of the present invention is configured to expose a pattern of an original on a substrate by using light from a light source. The exposure apparatus includes an illumination optical system configured to illuminate the original by polarized light by using the light from the light source, and a correction unit configured to correct misalignment of the optical axis of the light from the light source and the optical axis of the illumination optical system. The correction unit includes a first lens and a deflecting member. The first lens can move in a direction perpendicular to an optical axis of the lens, and a deflecting direction of the light deflected by the deflecting member is variable.

Further features of the present invention will become apparent from the following description of exemplary embodiments with reference to the attached drawings.

DESCRIPTION OF THE EMBODIMENTS

Referring now to the accompanying drawings, a description will be given of embodiments of the present invention.

First Embodiment

Figure 1:
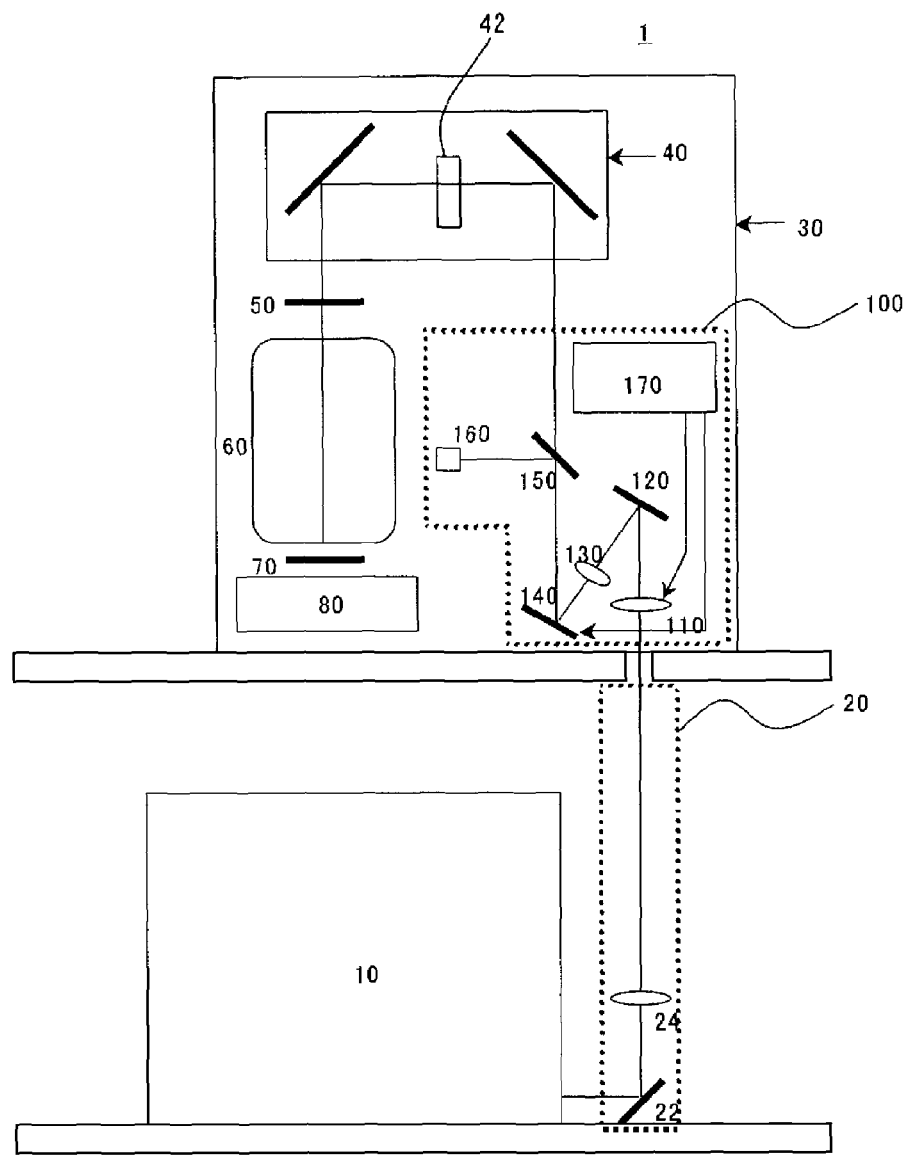
FIG. 1 is a diagram showing a simplified light path of an illustrative exposure apparatus of the present invention.

Referring now to the accompanying drawings, a description will be given of an exposure apparatus 1 according to a first embodiment of the present invention. Here, FIG. 1 is a diagram which shows a simplified light path from a light source unit 10 to the exposure apparatus 1. The exposure apparatus 1 includes an illumination optical system 40, a projection optical system 60, a stage and an optical axis correction unit 100 that are arranged in a chamber 30 as shown in FIG. 1. A light source unit 10 is separated from the exposure apparatus 1, and is arranged on the different floor from that of the exposure apparatus 1 in FIG. 1. However, it is not always required that they are arranged at different floors. Thus, it is sufficient that the exposure apparatus 1 and the light source unit 10 are different bodies that are separated from one another. The light source unit 10 has an excimer laser having a wavelength equal to or less than 200 nm as a light source (an ArF excimer laser having a wavelength of 193 nm, a $F_2$ laser having a wavelength of 153 nm, etc). However, the present invention does not limit a type of the laser to excimer lasers, or does not limit number of the laser. The excimer laser is arranged as a separate body from the exposure apparatus 1 since it is relatively large. It can be applied widely if the size of the light source unit 10 is not limited and separated into a plurality of parts from the exposure apparatus 1. Therefore, a light source that can be used for the light source unit 10 is not limited to a laser, but one or more mercury lamp(s) or xenon lamp(s) can be also used. The light source unit 10 and the exposure apparatus 1 are separately arranged, and have different setting environments (a frequency or a phase of the floor oscillation on each floor) from one another.

A pulling optical system 20 is an optical system which guides a light flux from the light source unit 10 to the exposure apparatus 1 by pulling it around, and optically connects the light source unit 10 to the exposure apparatus 1. The pulling optical system 20 includes a mirror 22 and a lens 24 in this embodiment, but the present invention is not limited to this configuration.

Light enters the exposure apparatus 1 via light incident windows that are arranged in the light source 10, the pulling optical system, and the chamber 30. As shown in FIG. 1, the exposure apparatus 1 is a projection exposure apparatus that exposes an image of a pattern of the reticle 50 as an original onto the wafer 70 by applying step-and-scan method. The exposure apparatus 1 may also apply a step-and-repeat method.

The illumination optical system 40 is an optical system configured to uniformly illuminate a reticle 50. The illumination optical system 40 further has a polarization control unit 42 configured to illuminate (i.e., to implement a polarization illumination) the reticle 50 in a predetermined polarization state (polarized light). The polarization unit 42 partially changes the polarization direction of the light of approximately linear polarized light emitted from the light source. As disclosed in Japanese Patent Laid-Open No. 2006-5319, a linear polarizer and a λ/4 phase plate may be combined for such a polarization control unit, or a polarized illumination and an off axis illumination may be also combined.

The reticle 50 is for example, made of quartz, on which a pattern to be transferred on a wafer 70 is formed and supported by a reticle stage that is not shown in the drawings. The diffraction light from the illuminated reticle 50 passes through the projection optical system 60, and forms an image on the wafer 70. The reticle 50 and the wafer 70 have a conjugate relationship in their positions to one another. In this embodiment, the pattern of the reticle 50 is transferred onto the wafer 70 by relatively moving the reticle 50 and the wafer 70.

The projection optical system 60 projects the image of pattern of the reticle 50 as the original onto the wafer 70. The projection optical system 60 may apply any of a refracting system, a catadioptric system, or a reflecting system. In this embodiment, a high NA is achieved in the NA of the projection optical system 60 being equal to or greater than 0.9. This embodiment does not limit the medium between the projection optical system 60 and the wafer 70 to a dry system such as air (or purged gas), but may also apply an immersion system that fills liquid having a refractive index greater than that of air. This approach can further achieve a high NA.

Figure 2:
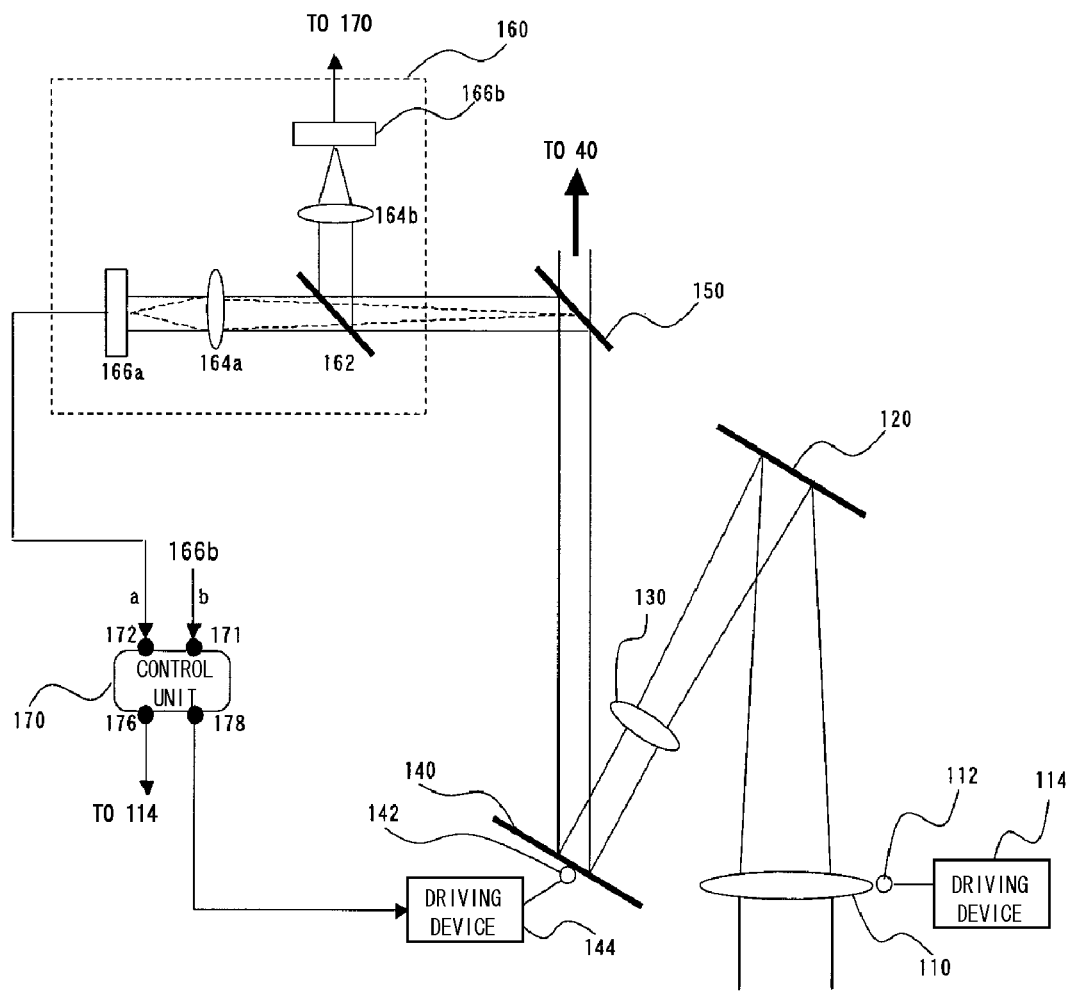
FIG. 2 is a diagram showing a detailed view of an optical axis correction unit according to a first embodiment.

The wafer 70 is an example of a substrate (an object to be exposed), and a resist is applied to the wafer. A substrate is not limited to the wafer, but can be also applied to a liquid crystal substrate or other substrates. The wafer 70 is driven and supported by a stage 80. An optical axis correction unit (a correction device) 100 shown in FIG. 2 corrects misalignment of optical axes of two optical apparatuses, the light source unit 10 and the exposure apparatus 1. In other words, it corrects the misalignment of the optical axis of the laser light from the light source unit 10 and the optical axis of the illumination optical system from the exposure apparatus (hereinafter referred to as misalignment of an optical axis). The correction apparatus can be enlarged to a correction apparatus that corrects the misalignment of the optical axes of two separate optical apparatuses that are configured such that light emitted from one apparatus enters the other one. FIG. 2 is a detailed view of the optical axis correction unit 100 shown in FIG. 1. Here, the misalignment of the optical axes includes angular and positional misalignment.

The optical axis correction unit 100 includes a lens (a first lens) 110 and a lens (a second lens) 130, and further includes a mirror (a second mirror) 120 and a mirror (a first mirror) 140 as deflecting members. In this way, the optical axis correction unit 100 includes (the first) lens 110, (the second) mirror 120, (the second) lens 130, and (the first) mirror 140 that are arranged along a light path in order of the distance from the light source side. The optical axis correction unit 100 further includes a driving parts (the first driving part) 112 and (the second driving part) 142, driving devices 114 and 144, a beam splitter 150, a detection optical system 160, and a control unit 170. Other than the mirrors, a variable apex angle prism can be also used as a deflecting member. The variable apex angle prism is configured by enclosing liquid between two transparent glass plates by using resinous bellows. It is an optical member configured to make angles (apexes) formed by the two transparent glass plates variable. In the case of using the variable apex angle prism as a deflecting member, since the light is transmitted and the polarization direction of the light is changed, the light path may differ from that when the light is reflected and polarized by mirrors.

The lens 110 and the lens 130 comprise an a focal lens system configured to set a parallel light flux emerging from the pulling optical system 20 to a predetermined size. The positional and angular misalignment can be corrected by enabling the lens 110 to two-dimensionally move on a plane perpendicular to the optical axis of the lens 110 or to a central light beam that is a reference of the laser. The lens can be moved by a user or the driving part as described hereinafter.

In this embodiment, the driving part 112 that moves the lens is connected to the lens 110. The driving part 112 can drive the lens 110 two-dimensionally as described above. The driving part 112, for example, includes a driving axis that is connected to the barrel of the lens 110 in perpendicular plane to the paper in FIG. 2 and a gear that joints in the driving axis. The driving part 112 is connected to and driven by the driving device 114. The driving device 114, for example, includes a motor and a gear that joints a gear of the driving part 112 and the axis of the motor. As a result, the rotation of the motor is transferred to the driving axis of the driving part 112 and the mirror 110 moves when energization to the motor of the driving device 114 is controlled. Then, the position and the angle of the optical axis of the laser beam are changed.

The positional and angular misalignment of the optical axes can be corrected by rotating the lens 110 concurrently with the mirrors. The mirrors can be rotated by a user or driven by the driving part, in similar manner to the lens being moved or driven. In this embodiment, a driving part 142 that changes an angle of the mirror's arrangement is connected to the mirror 140 having flat surfaces. For example, it is comprised of an axis that can rotate around an axis being perpendicular to a paper plane in FIG. 2 and an axis that can rotate around an axis being perpendicular to the rotating axis and parallel to the reflected surface of the mirror. The driving part 142 is connected to and driven by the driving device 144. The driving device 144, for example, includes a motor and a gear that joints a gear of the driving part 142 and in the motor axis of the motor. As a result, the rotation of the motor axis is transferred to the driving axis of the driving part 142, and the mirror 140 rotates when energization to the motor of the driving device 144 is controlled. Then, the angle of the laser beam incident upon the mirror 140 is changed. As an alternative driving method, it is conceived that piezoelectric elements arranged in the back of the mirror can drive the driving part.

It is difficult to design a film having a high reflective index to the entire range of the incident angle having a large angle because the film material that forms the reflective film is limited in a wavelength range having a short wave length. Both S-polarized light and P-polarized light may be incident upon the mirror 140 depending on the arrangement of the pulling optical system 20 which pulls along a light flux from the light source unit 10 to the exposure apparatus 1. Then, it is further difficult to design a film because a film with a high reflective index is required for both the S-polarized light and the P-polarized light.

The surfaces of the mirrors 120 and 140 can be coated with dielectric multilayer films when the laser durability is considered, but the bandwidths of the reflection are generally narrow and highly dependent on the light incident angles. For this reason, the mirrors 120 and 140 are arranged such that the range of the light incident angle is as low as possible in order to prevent the reflective index of the reflective film from being reduced. Specifically, the maximum light incident angle falls in a range of 0 to 45 degrees more preferably the incident light angle falls in a range of 0 to 30 degrees even when the rotation angle is being adjusted. A high reflective index can be obtained over the entire range of the incident angle even by adjusting the misalignment of the optical axis when the range of the incident angle is preset to be narrow.

A beam splitter 150 transmits most of the light from the mirror 140, and reflects a part of that. The light passing through the beam splitter 150 becomes exposure light by entering the illumination optical system 40, and the light reflected on the beam splitter 150 enters a detection optical system 160 that is a detecting device configured to detect the misalignment of the optical axis. The light can be detected from the mirror 140 by inserting the switching mirror into the light path only when necessary in order to increase illuminance efficiency during exposure, instead of always detecting the light from the mirror 140 by the beam splitter 150.

The detection optical system 160 includes a first detection optical system and a second illumination optical system. The first detection optical system is comprised of a beam splitter 162, an imaging lens 164a, and a detecting device (a first detecting unit) 166a. The second detection optical system includes a beam splitter 162, a Fourier Transform lens 164b, and a detecting device (a second detecting unit) 166b. The imaging lens 164a arranges the beam splitter 150 and the detecting device 166a in a substantially conjugated relationship. Fourier Transform lens 164b arranges the beam splitter 150 and the detecting device 166b as a relationship between an image and a pupil. Alternatively, the light incident upon the detecting device 166a may be light reflected from the beam splitter 162, and the light incident upon the detecting device 166b may be light transmitted from the beam splitter 162.

In this embodiment, the detecting devices 166a and 166b include a charge coupled device ("CCD"), which can detect a positional distribution of light intensity. However, the detecting devices 166a and 166b are not necessarily limited to the CCD, but a CMOS sensor, a four detecting devices split sensor that can measure the distribution of the light intensity, or a position sensor diode ("PSD") that can detects incident beam may be also used for the detecting devices.

The control unit 170 controls the detecting devices 114 and 144 based on the detecting result by the detecting optical system 160, in order to eliminate the positional and angular misalignment of the optical axes.

Figure 3:
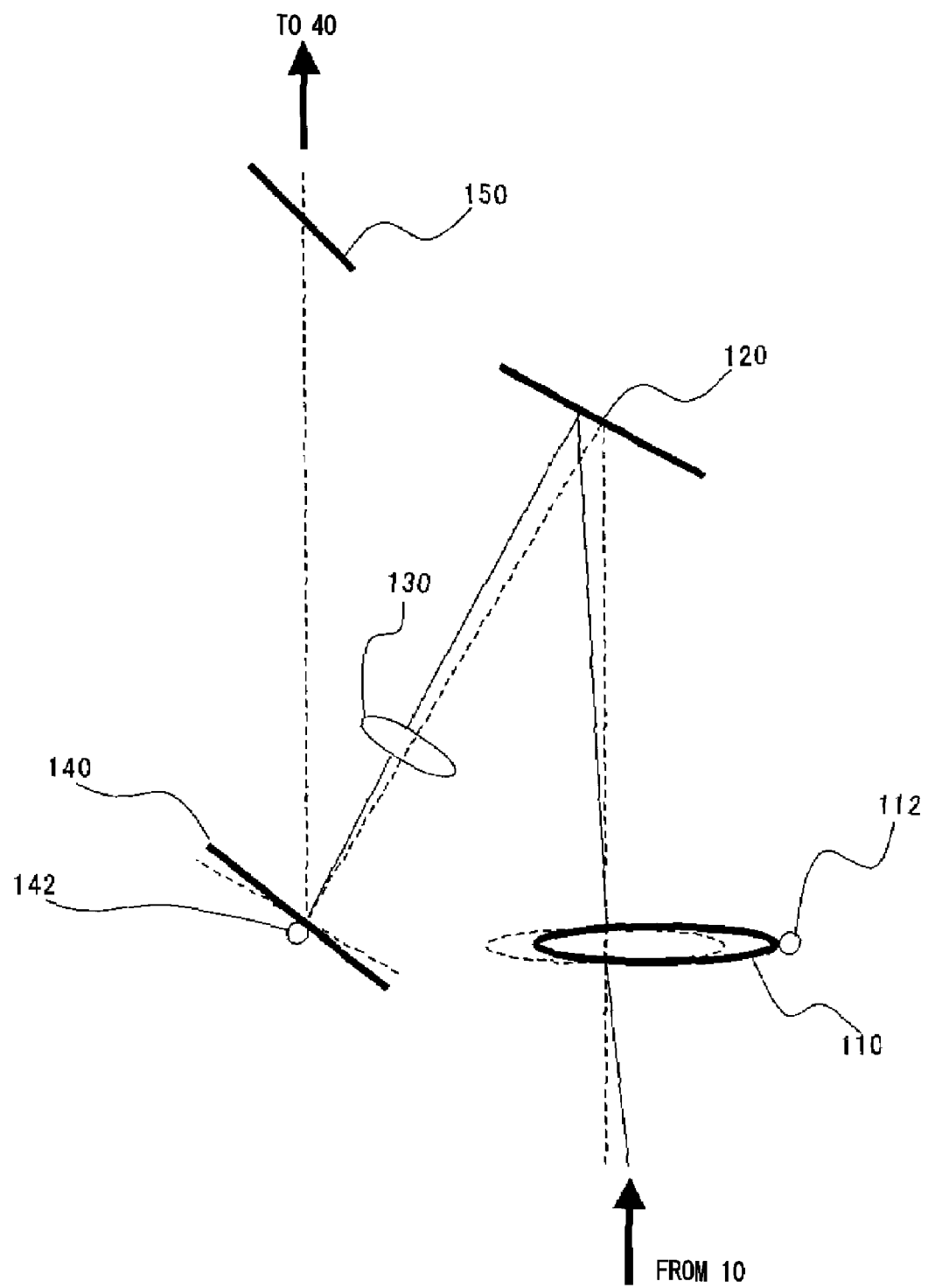
FIG. 3 is a diagram which describes the case where the optical axis correction unit shown in FIG. 2 corrects an angular misalignment of an optical axis.
Figure 4:
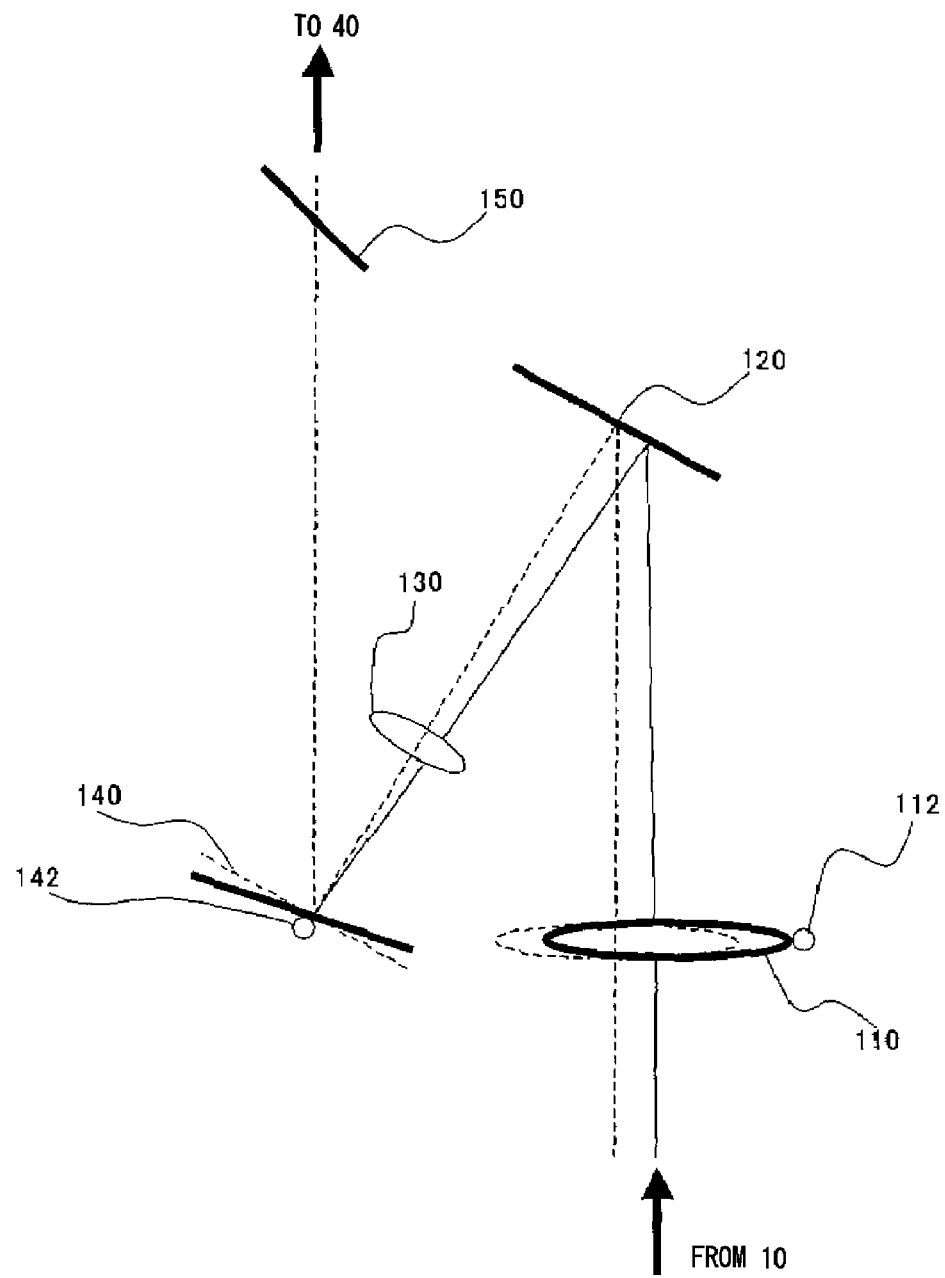
FIG. 4 is a diagram which describes the case where the optical axis correction unit shown in FIG. 2 corrects a positional misalignment of an optical axis.

Referring now to FIGS. 3 and 4, a description will be given on an operation of the optical axis correction unit 100. FIG. 3 is a diagram which describes the case where the optical axis correction unit 100 corrects the angular misalignment of the optical axis. FIG. 4 is a diagram which describes the case where the optical axis correction unit 100 corrects the positional misalignment of the optical axis. A condition represented by dashed lines indicates an ideal condition in which the central beam of the light (an optical axis) is in a reference position. This embodiment will describe only a case that the optical axis correction unit 100 corrects the misalignment of the optical axis in a position parallel to the paper plane for convenience, although the description is not limited to this case, and the optical axis correction unit 100 can also correct the misalignment of the optical axis in a position perpendicular to the paper plane.

The parallel light flux emitted from the light source unit 10 is pulled around by the pulling optical system 20, and enters the optical axis correction unit 100 in the exposure apparatus 1. The central beam of the light incident upon the exposure apparatus 1 may be misplaced from the optical axis of the illumination optical system in the angle or the position due to a difference in setting positions between the light source unit 10 and the exposure apparatus 1.

In the optical axis correction unit 100, the misalignment occurring by decentering the lens 110 that comprises an a focal optical system with the lens 130 changes both the angle and position incident upon the mirror 140, and results in a contribution factor of the positional and angler misalignment of the optical axis to the illumination system 40. Similarly, the misalignment occurred by rotating the mirror 140 is a contributing factor of both the positional misalignment occurred by passing along the light path with the angular misalignment to the illumination optical system 40 and the angular misalignment. Two decentering members of the lens 110 and the mirror 140 are arranged for prevention of having a conjugate relationship. Thus, the cooperative action by the lens 110 and the mirror 140 can independently adjust the positional misalignment and the angular misalignment of the parallel light flux that reaches the entrance of the illumination optical system 40. Here, the positional misalignment amount and the angular misalignment amount are conceived to be differences from reference positions, assuming that the reference positions are outputs being optimal optical axis adjusting conditions (detecting conditions of the detecting devices 166a and 166b) to the illumination optical system 40. The reference positions are saved in the devices by adjusting the optical axes, and the lens 110 and the mirror 140 are driven so as to be fitted into the memory devices. For example, when the optical axis of the illumination optical system 40 and the central beam (an optical axis) of the light incident upon the illumination optical system 40 have a coincident position and angle with one another, they can be in a reference position.

Assuming that Sx is a decentering driving amount of the lens 110 (a traveling distance Sx), Tx is a tilting driving amount of the mirror 140 (a deflecting member), the following equation is given where X1 is an amount of an internal positional misalignment detected by the detecting device 166a, and X2 is an amount of internal angular misalignment detected by the detecting device 166b.

$$X1 = a \cdot Sx + b \cdot Tx \quad \text{EQUATION 1}$$

$$X2 = c \cdot Sx + d \cdot Tx \quad \text{EQUATION 2}$$

Here, constants a and b are sensitivities to the degrees of the positional misalignment to Sx and Tx. Constants c and d are sensitivities to the degrees of the angular misalignment to Sx and Tx. Since two optical members that can be driven are arranged to have no conjugate relationship, they have different ratios of the sensitivities to the positional or angular misalignment due to driving, and have the condition c/a≠d/b. X1 and X2 as degrees of positional and angular misalignment detected can be equal to zero by driving at least one of the lens 130 and the mirror 140 by Sx and Tx being expressed as follows:

$$Sx=(d \cdot X1-b \cdot X2)/(a \cdot d-b \cdot c) \quad \text{EQUATION 3}$$

$$Tx=(-c \cdot X1+a \cdot X2)/(a \cdot d-b \cdot c) \quad \text{EQUATION 4}$$

X1=0 where the misalignment of the optical axis between the light source unit 10 and the exposure apparatus 1 is only the angular misalignment as shown in FIG. 3, the optical axis of the light (the central beam) that forms a distribution of a light intensity on the back stage of the mirror 140 can be corrected to the same condition that no angular misalignment is occurred by driving at least one of the lens 110 and the mirror 140 by Sx and Tx being expressed as follows:

$$Sx=-b \cdot X2/(a \cdot d \cdot b \cdot c) \quad \text{EQUATION 5}$$

$$Tx=a \cdot X2/(a \cdot d-b \cdot c) \quad \text{EQUATION 6}$$

Meanwhile, X2=0 where the misalignment of the optical axis of the light source unit 10 and the exposure apparatus 1 is only a positional misalignment as shown in FIG. 4, the optical axis of the light (the central beam) that forms a distribution of a light intensity on the back stage of the mirror 140 can be corrected to the same condition that no positional misalignment is occurred by driving at least one of the lens 110 and the mirror 140 by Sx and Tx being expressed as follows:

$$Sx=d \cdot X1/(a \cdot d-b \cdot c) \quad \text{EQUATION 7}$$

$$Tx=-c \cdot X1/(a \cdot d-b \cdot c) \quad \text{EQUATION 8}$$

According to the preventions described in Japanese Patent Laid-Open No. 11(1999)-145033 and Japanese Patent Laid-Open No. 2000-77315, assuming that a maximum titling angle of a parallel plate is 20 degree, and a refractive index is 1.5, the parallel plate of 122 mm thick must be used in order to correct the plate of ±15 mm at maximum.

Assuming that transmission of a glass material is 99.5% per 1 cm, transmission of an optical member becomes approximately only 94% that is 0.995 to the $12.2^{nd}$ power. Two plates are needed in both x direction and y direction when the transmission is 94% per a parallel plate. Then, the transmission becomes 88.5% per two plates. Further, transmission of an anti-reflection film needs to be applied to the transmission of the optical member. As a result, transmission that is equal to or less than 88.5% is needed in order to correct two-dimensional optical axis. Meanwhile, the optical axis correction unit in this embodiment can obtain transmission that is equal to or greater than 94% because the transmission is lost only by the anti-reflection film of the mirror and the transmission of the lens 130.

In the wavelength range having a short wavelength, use of a glass material having a high transmission is limited, so calcium fluoride ($CaF_2$) may be used for the lens 110 by considering the durability. The calcium fluoride has intrinsic birefringence, and the adjustment by tilting the parallel plate described in Japanese Patent Laid-Open No. 11(1999)-145033 and Japanese Patent Laid-Open No. 2000-77315 may change the degree of the birefringence in accordance with the beam directions in the crystal. If quartz is used for the lens 110, a similar problem may arise because the quartz has a birefringence due to remaining stress in the glass.

In this embodiment, the lens 110 is moved in a plane perpendicular to the optical axis in order to cope with this problem. In FIG. 4, the optical axis of the lens 110 and the principal beam of the light flux from the optical axis are parallel to one another, so the influence exerted by the birefringence remains at minimum. Meanwhile, the light flux from the light source unit 10 is incident at an angle in FIG. 3. However, the lens 110 generally has a thickness of 10 mm approximately, which is sufficiently thinner than a parallel plate, and the misalignment of the optical axis from the lens 110 is up to approximately 2 degrees at a maximum angle. Therefore, the influence exerted on the birefringence is extremely low, compared with the parallel plate that tilts at an angle of around 20 degrees.

Referring now to FIG. 2 again, the beam incident upon the beam splitter 150 located in the optical axis correction unit 100 splits by the beam splitter 150, and the transmitted light moves toward the illumination optical system 40, and the light reflected on the beam splitter 150 enters the detecting optical system 160. The light incident upon the detecting optical system 160 is split by the beam splitter 162. The transmitted light is incident upon the detecting unit 166a that is arranged in substantial conjugation to the beam splitter 150 by the imaging lens 164a. The reflected light is incident upon the detecting device 166b that is arranged as a relationship between an image and a pupil to the beam splitter 150 by the Fourier Transform lens 164b. The detecting unit 166a detests positional information on the optical axis (the central beam) from the light source in the position of the beam splitter 150, and the detecting unit 166b detects the angular information on the optical axis (the central beam) from the light source in the position of the beam splitter 150. Therefore, according to the detecting optical system 160 in this embodiment, the control unit 170 controls driving of the lens 110 and the mirror 140 in accordance with outputs of the detecting devices 166a and 166b.

More specifically, the misalignment (X1, Y1) from the reference position in the detecting device 166a and the misalignment (X2, Y2) from the reference position in the detecting device 166b are measured. Then, the control unit 170 calculates the decentering driving amount (Sx, Sy) of the lens 110 and the tilting driving amount (Tx, Ty) of the mirror 140 in order to align the optical axis from (X1, Y1) and (X2, Y2) Then, the driving devices 114 and 144 drive the lens 110 and the mirror 140 by the calculated amounts. The control by the control unit 170 corrects the misalignment of the position of the beam splitter 150, in other words, the misalignment of the optical axis to the illumination optical system 40 (i.e., angular and positional misalignment), and will provide an incident condition optimal to the light flux.

In the above embodiment, the beam splitter 150 and the detecting device 166a are arranged in an approximately optically conjugate relationship via the imaging lens 164a. However, it is not limited to this embodiment, and the mirror 140 and the detecting device 166a can be also arranged in an approximately optically conjugate relationship via the imaging lens 164a. In this case, d=0 since the positional misalignment in the detecting device 166a does not occur even by rotating the mirror 140. X1 and X2 as degrees of positional and angular misalignment detected can be equal to zero by driving the lens 130 and the mirror 140 by Sx and Tx being expressed as follows:

$$Sx=b \cdot X2/(b \cdot c) \quad \text{EQUATION 9}$$

$$Tx=(c \cdot X1-a \cdot X2)/(b \cdot c) \quad \text{EQUATION 10}$$

Then a distribution of a light intensity in front of the mirror 140 can be corrected to the same condition that no angular misalignment is occurring.

In the above embodiment, the lenses 110 and 130 comprise the a focal optical system. However, the present invention is not limited to this embodiment, and the imaging system can be also comprised. The positional and angular misalignment of the parallel light flux that reaches the entrance of the illumination optical system 40 can be generated similarly by driving the lens in the optical system in the plane perpendicular to the optical axis.

In this embodiment, the control unit 170 controls the driving devices of the lens 110 and the mirror 140 based on outputs of the detecting devices 166a and 166b. However, the present invention is not limited to this embodiment. For example, a sensor which detects a light amount in the illumination optical system can be arranged, and a driving amount of the mirror 140 can be controlled such that the light amount is a maximum in the sensor based on the result of the detection.

More specifically, the positional element and the angular element of the optical axis can be moved individually in conjunction with two optical members that can be driven by using prospectively obtained sensitivities a to d (constants a to d). For this reason, the lens 110 and the mirror 140 are driven so as to at first move the positional element only, and the position having a maximum sensor output is searched. Next, the positional element is stored, the lens 110 and the mirror 140 are driven to move the angular element, and the position having a maximum sensor output is searched. In this way, the misalignment of the optical axis is corrected by repeating searching for the position and the angle that have maximum sensor outputs, and the optimum light flux incident condition can be obtained.

According to this embodiment, high-resolution can be achieved by using polarized illumination since the misalignment of the optical axis is corrected without using a parallel plate.

Second Embodiment

Figure 5:
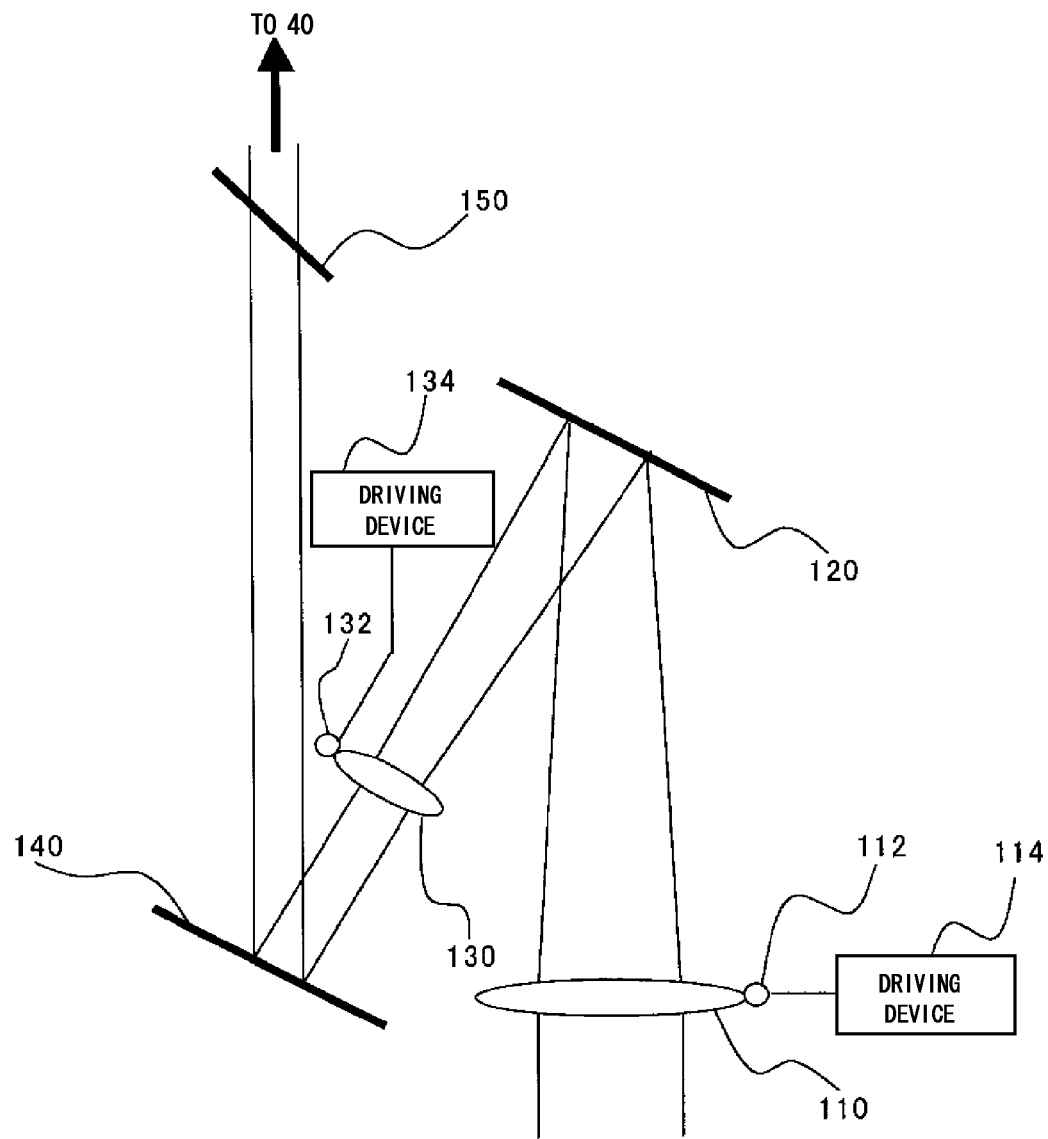
FIG. 5 is a diagram showing a detailed view of the optical axis correction unit according to the second embodiment.

FIG. 5 is a schematic diagram that shows a configuration of the optical axis correction unit according to the second embodiment of the present invention. The optical axis correction unit according to this embodiment corrects the positional misalignment and the angular misalignment of the central axis of the light from the light source 10 and the optical axis in the illumination optical system in the exposure apparatus 1, by two-dimensionally moving the lenses 110 and 130 in a place perpendicular to a reference axis. The mirrors 120 and 140 fold the light path, but the process thereof may be omitted.

The driving part 112 is connected to the lens 110, and the driving part 132 is connected to the lens 130. In this embodiment, the lenses 110 and 130 can be driven two-dimensionally in a plane perpendicular to the reference axis. The driving parts 112 and 132 for example include axes connected to the barrels on the lenses 110 and 130 in perpendicular to the plane in FIG. 2 and gears that joint the axes. The driving parts 112 and 132 are connected to and driven by the driving devices 114 and 134 respectively. The driving devices 114 and 134 for example include motors and gears that joint the motor axes of the motors and the gears of the driving parts 112 and 132. As a result, the rotation of the motor axes is transferred to the driving axes of the driving parts 112 and 132, and the lenses 110 and 130 move when energization to the motors of the driving devices 114 and 134 are controlled. Then, the position and the angle of the optical axes of the illumination light are changed. The control by the control unit in the second embodiment is similar to that described in the first embodiment, and a detailed description thereof will be omitted.

Hereinafter, a description will be given of the operation of the exposure apparatus 1. On exposure, after the light flux emitted from the light source unit 10 enters the exposure apparatus 1, the misalignment is corrected by the optical axis correction unit 100, and the light enters the illumination optical system 40 via the beam splitter 150. Then, the light incident upon the illumination optical system 40 implements polarized illumination on the reticle 50. The optical axis correction unit 100 corrects the misalignment of the optical axis of the light incident upon the illumination optical system 40, and at this time, the optical axis correction unit 100 does not use a parallel plate. For this reason, the exposure apparatus 1 can maintain the high transmittance and the polarization performance, and improve the resolution and the throughput.

A device such as a semiconductor integrated circuit device and a liquid crystal display device can be manufactured by the steps of exposing a photoresist applied substrate such as a wafer or a glass substrate by using the exposure apparatus in any of the above embodiments, developing the substrate, and any other known steps. This device manufacturing method can provide a device which has a quality higher than those of any other conventional devices.

In the embodiments described above, the optical axis correction unit 100 is housed in the exposure apparatus 1, although it may be arranged outside of the exposure apparatus 1. For example, the optical axis correction unit 100 may be arranged in the pulling optical system 20 or the light source unit 10. Alternatively, the exposure apparatus 1 may house at least any one of the pulling optical system 20 and the light source 10, and then the exposure apparatus 1 may house the optical axis correction unit 100 concurrently. However, the light flux from the light source unit 10 may be incident upon the optical axis correction unit 100 directly instead of using the pulling optical system 20.

The beam splitter 150, the detecting optical system 160, and the light correction unit 100 may be constructed as separated bodies.

The optical axis correction unit 100 includes, in order from the light source side, the lens, the mirror, the lens, and the mirror, but also it may include, in order from the light source side, the mirror, the mirror, the lens, and the lens.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-264590, filled on Oct. 10, 2007, which is hereby incorporated by reference herein its entirety.

What is claimed is:

1. An exposure apparatus configured to expose a pattern of an original on a substrate by using light from a light source, said exposure apparatus comprising:

an illumination optical system configured to illuminate the original by polarized light by using the light from the light source;

a correction unit configured to correct misalignment of an optical axis of the light from the light source and an optical axis of the illumination optical system; and a detecting device configured to detect the misalignment of the optical axes, wherein the correction unit includes a first lens and a deflecting member, the first lens can move in a direction perpendicular to an optical axis of the first lens, and a deflecting direction of the light deflected by the deflecting member is variable, wherein the correction unit moves at least one of the first lens and the deflecting member, and corrects the misalignment of the optical axes based on a result detected by the detecting unit, wherein the detecting unit comprises:

a first detecting unit configured to detect a positional misalignment X1 of the misalignment of the optical axes; and a second detecting unit configured to detect an angular misalignment X2 of the misalignment of the optical axes, and wherein the detecting unit further comprises:

a control unit configured to set a traveling distance Sx of the first lens and a driving amount Tx of the deflecting member by using constants a to d as follows:

$Sx=(d \cdot X1 - b \cdot X2)/(a \cdot d - b \cdot c)$ $Tx=(-c \cdot X1 + a \cdot X2)/(a \cdot d - b \cdot c)$ $c/a \neq d/b$.

2. An exposure apparatus according to claim 1, wherein the first lens and the deflecting member are arranged in positions that are not optically conjugate.

3. An exposure apparatus according to claim 1, wherein the deflecting member is a first mirror, and the deflecting direction changes due to rotation of the first mirror.

4. An exposure apparatus according to claim 3, wherein the correction unit includes a second lens and a second mirror.

5. An exposure apparatus according to claim 4, wherein the correction unit includes the first lens, the second mirror, the second lens, and the first minor that are arranged along a light path in order of the distance from the light source side.

6. An exposure apparatus according to claim 3, wherein a maximum incident angle of light which enters the first minor is in a range of 0 to 45 degrees.

7. An exposure apparatus according to claim 4, wherein a maximum incident angle of light which enters the second minor is in a range of 0 to 45 degrees.

* * * * *